(12) United States Patent
Chen et al.

(10) Patent No.: US 11,300,620 B2
(45) Date of Patent: Apr. 12, 2022

(54) GAS-LIQUID DYNAMIC MODEL-BASED ACCURATE LITHIUM-ION BATTERY SOC ESTIMATION METHOD

(71) Applicant: Jiangsu University, Jingkou Zhenjiang (CN)

(72) Inventors: Biao Chen, Jingkou Zhenjiang (CN); Haobin Jiang, Jingkou Zhenjiang (CN); Huanhuan Li, Jingkou Zhenjiang (CN); Yaping Wang, Jingkou Zhenjiang (CN); Qian Zhao, Jingkou Zhenjiang (CN)

(73) Assignee: Jiangsu University, Jiangsu (CN)

( * ) Notice: Subject to any disclaimer, the term of this patent is extended or adjusted under 35 U.S.C. 154(b) by 318 days.

(21) Appl. No.: 16/626,252

(22) PCT Filed: Dec. 19, 2017

(86) PCT No.: PCT/CN2017/117192
§ 371 (c)(1),
(2) Date: Dec. 23, 2019

(87) PCT Pub. No.: WO2019/113999
PCT Pub. Date: Jun. 20, 2019

(65) Prior Publication Data
US 2020/0158783 A1 May 21, 2020

(30) Foreign Application Priority Data
Dec. 14, 2017 (CN) .......................... 201711337881.6

(51) Int. Cl.
*G01R 31/367* (2019.01)
*G01R 31/388* (2019.01)
(Continued)

(52) U.S. Cl.
CPC ......... *G01R 31/367* (2019.01); *G01R 31/388* (2019.01); *H01M 10/0525* (2013.01); *H01M 10/4285* (2013.01)

(58) Field of Classification Search
CPC ............... G01R 31/367; G01R 31/388; H01M 10/0525; H01M 10/4285
See application file for complete search history.

(56) References Cited

U.S. PATENT DOCUMENTS

2005/0052810 A1* 3/2005 Suntio ................... H01M 10/48
361/115
2011/0060565 A1* 3/2011 Sciarretta .......... H01M 10/4285
703/2
(Continued)

FOREIGN PATENT DOCUMENTS

| CN | 103439668 A | 12/2013 |
|---|---|---|
| CN | 106019164 A | 10/2016 |

(Continued)

*Primary Examiner* — Raymond L Nimox
(74) *Attorney, Agent, or Firm* — Greensfelder, Hemker & Gale, P.C.; Richard C. Himelhoch

(57) ABSTRACT

A gas-liquid dynamic model-based accurate lithium-ion battery SOC estimation method, the gas-liquid dynamic model being a cylindrical closed container, a pipe and a valve that can be opened or closed being mounted at the top of the container, a liquid having a volume of Vw being held in the cylindrical container, and the remaining volume, V, being the volume of a gas having a pressure of P. According to the accurate SOC estimation method, a model, different from conventional RC equivalent circuit model and electrochemical model, is established from the perspective of a gas-liquid coexistence system. The method comprises the following steps: setting up an ideal gas state equation, a gas continuous motion equation, a gas-liquid dissolution equilibrium equation, etc. according to a gas-liquid coexistence system model; deriving steady state and transient state (Continued)

Figure 1:
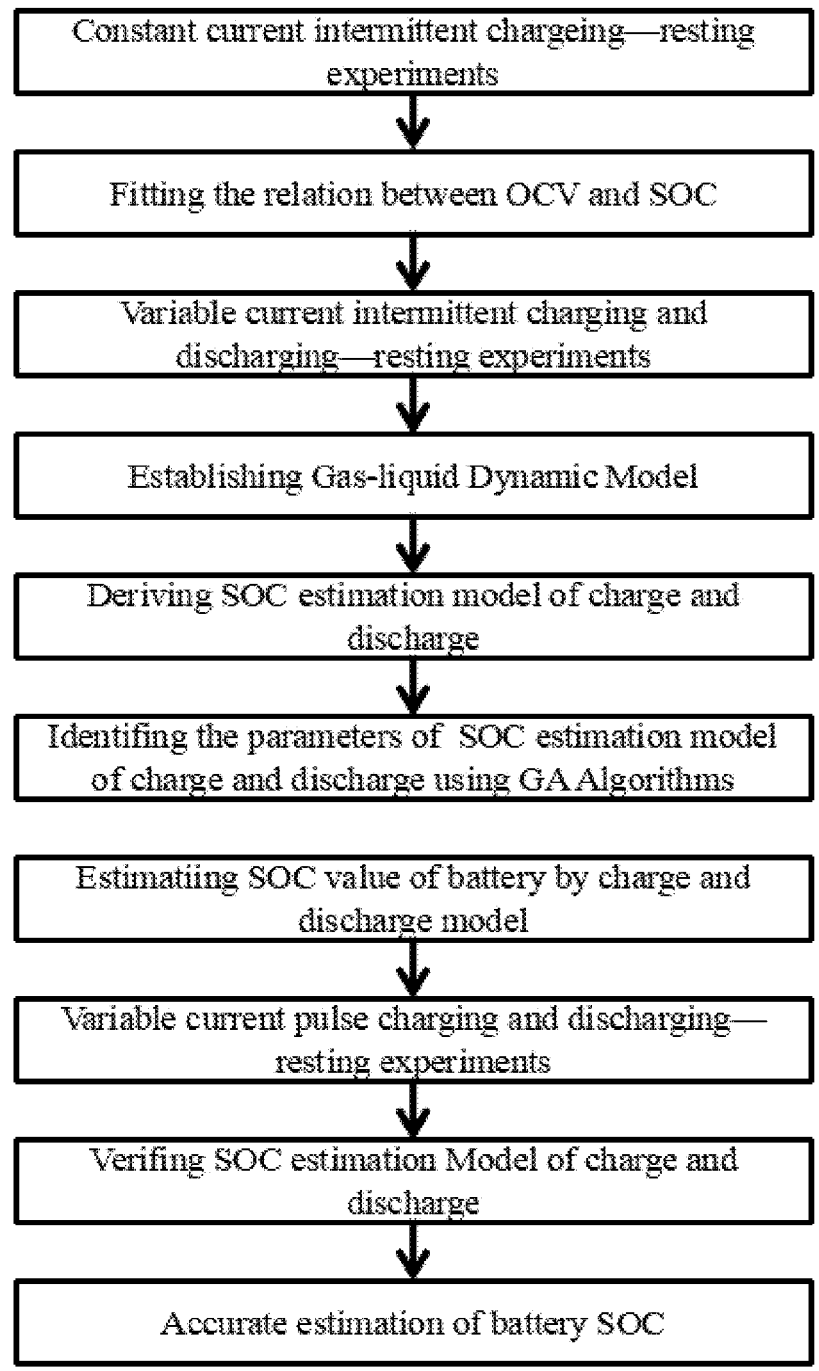

recursion formula of the gas-liquid coexistence system according to the model equations; performing intermittent charging and discharging stationary test on a certain model of battery; and fitting the expression of the relation between SOC and open circuit voltage, and recognizing parameter values of the gas-liquid coexistence system model, so as to achieve online estimation of a battery SOC value. The recursion formula is simple, has self-convergence characteristics, and can accurately describe the nonlinear characteristics of the battery.

10 Claims, 7 Drawing Sheets

(51) Int. Cl.
    *H01M 10/0525*      (2010.01)
    *H01M 10/42*      (2006.01)

(56) References Cited

U.S. PATENT DOCUMENTS

| | | | |
|---|---|---|---|
| 2014/0210418 A1* | 7/2014 | Wang | H02J 7/00 320/134 |
| 2014/0272653 A1* | 9/2014 | Chaturvedi | H01M 8/04582 429/431 |
| 2014/0350877 A1* | 11/2014 | Chow | G06F 30/367 702/63 |
| 2019/0162791 A1* | 5/2019 | Farag | G01R 31/3648 |

FOREIGN PATENT DOCUMENTS

| | | |
|---|---|---|
| CN | 106405433 A | 2/2017 |
| WO | 2014119123 A1 | 8/2014 |

\* cited by examiner

GAS-LIQUID DYNAMIC MODEL-BASED ACCURATE LITHIUM-ION BATTERY SOC ESTIMATION METHOD

I. TECHNICAL FIELD

This present invention relates to the field of battery management systems and it is an accurate estimation method of SOC for lithium-ion batteries based on gas-liquid dynamics model, in particular to an online estimation of an electric vehicle power battery.

II. BACKGROUND ART

With the amount of traditional petroleum fuel energy decreasing, countries around the world are focusing on developing electric vehicle technology. The power battery is not only one of the three electric technologies but also one of the most critical core components of electric vehicles, because the overall performance of the power battery is directly related to the performance of the electric vehicle's cruising range, maximum speed, acceleration, maximum grade, charging time and safety. The main functions of the battery management system (BMS) include coordinated control of real-time monitoring of battery physical parameters, charging/discharging and precharge control, state of charge estimation, online diagnosis and early warning, balance management and thermal management. An accurate battery management system could help to extend battery life, lower battery lifecycle cost, improve battery safety, etc. (SOC) is an important basis for measuring battery health monitoring, charging and discharging control, energy distribution, and power balance, and is closely related to battery remaining capacity and functional power. The battery's operating current, temperature, cycle life, and harsh use are characterized by severe nonlinearity and obvious uncertainty. Therefore, online estimation of SOC technology is considered to be the core and difficulty of battery management system research and design.

At present, the commonly used power battery SOC estimation model basically has only equivalent circuit models and electrochemical models. The electrochemical model is mainly used to reflect the reaction mechanism inside the battery, and describe the macroscopic (voltage, current, resistance, etc.) and microscopic (ion concentration distribution, transmission, etc.) information related to the battery design parameters. Although the characterization of the electrochemical model is accurate, it is not applicable to real-time estimation of battery relation systems because of the huge complexity and large time consumption. The equivalent circuit model uses a voltage source, a capacitor, and a resistor to form a circuit to simulate the dynamic and static characteristics of the battery. The process is relatively straightforward and easy to handle, but there is a contradiction between the accuracy and complexity of the description. On one hand, the low-order RC circuit has the advantages of simple form and small amount in calculation, but it is not accurate enough to describe the dynamic characteristics of the battery. On the other hand, the high-order RC circuit model has a certain improvement in SOC estimation accuracy, but it leads to too many model parameters and increasing difficulty in parameter recognition and calculation, and when the order of the RC circuit is greater than the third order, improvements in SOC estimation accuracy will become very limited simply by increasing the RC order.

In summary, relying on only one existing battery SOC estimation model is far from being able to meet the requirements of practical applications, so it is important to build a new model which can more accurately describe the nonlinear relationship between battery SOC and OCV, and only requires simple analysis and computation. The model provided by this patent has these features.

III. CONTENTS OF THE INVENTION

The object of this invention is to solve the problems of low adaptability, low estimation accuracy, high complexity and large amount in calculation of present SOC estimation models. Therefore, an accurate estimation method of SOC for lithium-ion batteries based on gas-liquid dynamics model is proposed. The gas-liquid dynamic model is a cylindrical closed vessel. A pipe and a valve are installed at the top of the vessel. There is a certain volume of liquid V, in the cylindrical vessel and the remaining volume V of the vessel is filled with the gas whose pressure is P. This SOC accurate estimation method is different from the traditional RC equivalent circuit model and electrochemical model from the perspective of gas-liquid coexistence system, and it includes the following steps: According to the gas-liquid coexistence system model, the ideal gas state equation, gas continuous motion equation and gas-liquid dissolution equilibrium equation are listed; According to the model equations, the steady state and transient recursion formula of gas-liquid coexistence system are derived, and the intermittent charging and discharging test is performed on a certain type of battery; The formula of the relationship between the SOC and the open circuit voltage is fitted and the parameters of the gas-liquid coexistence system model are identified. And the real-time SOC estimation of the battery online (during the driving process) can be realized. The outstanding advantage of this model is that the recursive formula is simple, owning self-convergence characteristics, and can accurately describe the nonlinear characteristics of the battery. The off-line (that is, after the car is stopped or the battery is removed), parametric model can accurately estimate the battery SOC with an error of less than 2%. When the SOC is between 15% and 100%, the maximum relative error can be less than 1%. The most prominent advantage of the model is that the model is an analytical model with a small amount of calculation and the SOC estimation is decoupled from the time t.

The technical solution of this invention is: an accurate estimation method of SOC for lithium-ion batteries based on gas-liquid dynamics model, which comprises the following steps:

A constant current intermittent charging-static experiment is performed on a lithium ion battery, and the relationship between the open circuit voltage OCV and the SOC is fitted according to the measured data;

A variable current intermittent charging/discharging-static experiment is performed on a lithium ion battery. The open circuit voltage and corresponding SOC data is recorded to identify the parameter values of the gas-liquid dynamic model;

Establishment of a gas-liquid dynamic model: The physical prototype of the gas-liquid dynamic model is a cylindrical closed vessel which is a gas-liquid coexistence system. The pipe and valve are installed at the top of the vessel. There is $V_W$ volume of liquid in the cylindrical vessel and the remaining volume V of the vessel is filled with the gas whose pressure is P, the amount of substance is n and density is $\rho$. The resistance coefficient of whole pipeline and valve is $\mu$. The external nozzle gas pressure of the pipe is $P_O$. When this gas-liquid coexistence system is in balance, the amount of gas moles dissolved in liquid is $n_j$. The pressure change of the gas from the non-steady state to the steady state in this system is $P_S$;

Derivation of charging/discharging SOC estimation model: According to the gas-liquid dynamic model, the ideal gas state equation, the gas continuous motion equation and the gas gap filling solubility equation are listed;

According to the steady-state equation of gas-liquid model, the gas-liquid model transient equation is used to verify that the equations of gas-liquid steady state and transient state under discharging state have real roots and moreover, have only one positive real root;

According to the steady-state equation of gas-liquid model, the gas-liquid model transient equation is used to verify that the equations of gas-liquid steady state and transient state under charging state have real roots and moreover, have only one positive real root;

According to the variable current intermittent discharging-station experiment data, the parameters of the steady and transient recursion formula of the charging/discharging gas-liquid coexistence system are identified;

The SOC of the battery is estimated by using charging/discharging model;

A variable current pulse charging/discharging-station test on a lithium-ion battery is performed and the open circuit voltage and corresponding SOC data are recorded to verify the accuracy of predicting the open circuit voltage by the gas-liquid dynamic model;

Verification of the charging/discharging SOC estimation model: The variable current pulse charging/discharging-station test data are used to verify the accuracy of predicting the open circuit voltage by the gas-liquid dynamic model;

The verified charging/discharging SOC estimation model is used to realize the accurate estimation of SOC of lithium-ion battery.

In the above scheme, the specific steps of the gas-liquid model transient equation in the discharging state based on the steady-state equation of the gas-liquid model include the following steps:

The gas-liquid dynamic model is in steady state at time $t_1$. At this moment, the gas pressure is $P_1$, and the amount of gas substance is $n_1$, and the amount of gas substance dissolved in the liquid is $n_{j1}$. When the valve of the vessel is opened and the length of time is $\Delta t$, the gas in the system is released outward, and the flow rate of gas is $I$, and the resistance coefficient of whole pipeline is $\mu$, and the pressure of the external nozzle is $P_0$. The valve is closed at the time $t_2 = t_1 + \Delta t$, at which time the gas pressure is $P_2$ and the amount of the gas substance is $n_2$. After a period of time, the gas-liquid dynamic model reaches the steady state again. At this time, the gas pressure in the vessel is $P^*$, and the amount of gas substance dissolved in liquid is $n_{j2}$. $P_S$ is a pressure which changes when gas in the vessel changes from non-steady state to steady state. The continuity equation of gas flow when the gas come out of the vessel:

$$P_2 = P_0 + \tfrac{1}{2}\rho I^2 + \tfrac{1}{2}\mu\rho I,$$

$\rho$: the gas density

Further, at time $t_1$, the ideal gas state equation is $$P_1 V = n_1 RT,$$

wherein, T: thermodynamic temperature,
$P_1$: gas pressure,
$n_1$: the amount of gas substance,
V: gas volume,
R: thermodynamic constant;

Solubility equation for gas gap filling:

$$n_{j1} = \frac{P_1 \varphi_m V_w}{RT + b_m P_1},$$

$b_m$: Van derwal volume,
$V_w$: Liquid volume;
The continuity equation of gas flow:

$$P = P_0 + \tfrac{1}{2}\rho I^2 + \tfrac{1}{2}\mu\rho I,$$

$\rho$: the gas density
I: gas flow
$\mu$: the resistance coefficient of whole pipeline
When the time is $t_2$, ideal gas equation of state:

$$P_2 V = n_2 RT;$$

After the system reaches the steady state again after $t_2$, the ideal gas state equation:

$$P^* V = n^* RT;$$

Solubility equation for gas gap filling:

$$n_j^* = \frac{P^* \varphi_m V_w}{RT + b_m P^*}$$

the amount of gas substances is $$n^* = n_2 + n_{j1} - n_j^*;$$

The changing pressure of gas during steady state, that is, the transient equation of gas-liquid model under discharging state:

$$\begin{aligned}
P_s &= P^* - P_2 \\
&= \frac{RT}{V}(n_2 + n_{j1} - n_j^*) - P_2 \\
&= \frac{RT}{V}(n_{j1} - n_j^*); \\
&= \frac{RT}{V}\left(\frac{P_1 \varphi_m V_w}{RT + b_m P_1} - \frac{P^* \varphi_m V_w}{RT + b_m P^*}\right) \\
&= \frac{R^2 T^2 \varphi_m V_w}{V b_m^2} \times \left(\frac{1}{\frac{RT}{b_m} + P^*} - \frac{1}{\frac{RT}{b_m} + P_1}\right);
\end{aligned}$$

Let $k_1 = \dfrac{R^2 T^2 \varphi_m V_w}{V b_m^2},\ k_2 = \dfrac{RT}{b_m};$

From this, the implicit function relationship between the first steady state $P_1$, the transient $P_2$, and the second steady state $P^*$ is derived:

$$P^* - P_2 = \frac{k_1}{k_2 + P^*} - \frac{k_1}{k_2 + P_1}$$

The physical parameters in this model are non-negative, therefore $k_2 + P^* > 0$ and $k_2 + P_1 > 0$, and the above formula can be rewritten as:

$$P^{*2} + P^* \times \left(k_2 - P_2 + \frac{k_1}{k_2 + P_1}\right) + \left(\frac{k_1 k_2}{k_2 + P_1} - P_2 k_2 - k_1\right) = 0$$

Actually, this equation is a quadratic equation about P*. Supposing $$a = 1, b = \left(k_2 - P_2 + \frac{k_1}{k_2 + P_1}\right), c = \left(\frac{k_1 k_2}{k_2 + P_1} - P_2 k_2 - k_1\right).$$

$$\Delta = b^2 - 4ac = \left(k_2 - P_2 + \frac{k_1}{k_2 + P_1}\right)^2 - 4\left(\frac{k_1 k_2}{k_2 + P_1} - P_2 k_2 - k_1\right)$$

The equation is simplified and rearranged as equation:

$$= \frac{1}{(k_2 + P_1)^2}[(k_2 + P_1)^4 + k_1^2 + 2(k_2 + P_1)(k_1 k_2 + k_1(2P_1 - P_2))]$$

Due to $P_1 > P_2$, so $\Delta = b^2 - 4ac > 0$. Therefore, the quadratic equation must have real roots.
Supposing:

$$F(x) = x^2 + x \times \left(k_2 - P_2 + \frac{k_1}{k_2 + P_1}\right) + \left(\frac{k_1 k_2}{k_2 + P_1} - P_2 k_2 - k_1\right);$$

Because of $F(0) \cdot F(+\infty) < 0$. Therefore, the discharging steady state and transient recursion formula must have an only positive real root:

$$P^* = \frac{\left[\begin{array}{c} P_2 k_2 + P_1 P_2 - k_2^2 - P_1 k_2 + \\ \sqrt{(k_2 + P_1)^4 + k_1^2 + 2(k_2 + P_1)[k_1 k_2 + k_1(2P_1 - P_2)]} \end{array}\right]}{2(k_2 + P_1)},$$

$$k_1 = \frac{R^2 T^2 \varphi_m V_w}{V b_m^2}, k_2 = \frac{RT}{b_m}$$

In the above scheme, the specific steps of the gas-liquid model transient equation in the charging state based on the steady-state equation of the gas-liquid model include the following steps:

The gas-liquid dynamic model is in steady state at time $t_1$. At this moment, the gas pressure is $P_1$, and the amount of gas substance is $n_1$, and the amount of gas substance dissolved in the liquid is $n_{j1}$. When the valve of the vessel is opened and the length of time is $\Delta t$, the outside gas is charged into the vessel at a flow rate of I, and the resistance coefficient of pipeline is $\mu$, and the pressure of the external nozzle is $P_0$. The valve is closed at the time $t_2 = t_1 + \Delta t$, at which time the gas pressure is $P_2$ and the amount of the gas substance is $n_2$. After a period of time, the gas-liquid dynamic model reaches the steady state again. At this time, the gas pressure in the vessel is $P^*$, and the amount of gas substance dissolved in liquid is $n_{j2}$. $P_S$ is a pressure which changes when gas in the vessel changes from non-steady state to steady state. The continuity equation of gas flow when the outside gas is charged into the vessel:

$$P_2 = P_0 - (\frac{1}{2}\rho I^2 + \frac{1}{2}\mu \rho I),$$

wherein, $\rho$: the gas density.
Further, at time $t_1$, the ideal gas state equation is $$P_1 V = n_1 RT,$$

T: thermodynamic temperature
$P_1$: gas pressure,
$n_1$: the amount of gas substance,
V: gas volume,
R: thermodynamic constant;
Solubility equation for gas gap filling:

$$n_{j1} = \frac{P_1 \varphi_m V_w}{RT + b_m P_1},$$

$\varphi_m$: Effective clearance
$b_m$: Van derwal volume
$V_w$: Liquid volume
The continuity equation of gas flow:

$$P_0 = P + \frac{1}{2}\rho I^2 + \frac{1}{2}\mu \rho I,$$

When the time is $t_2$, ideal gas equation of state:

$$P_2 V = n_2 RT$$

After the system reaches the steady state again after $t_2$, the ideal gas state equation:

$$P^* V = n^* RT;$$

Solubility equation for gas gap filling:

$$n_j^* = \frac{P^* \varphi_m V_w}{RT + b_m P^*}$$

$n_j^*$ is the amount of gas substance dissolved in the liquid after re-balance;
The relationship of amount of gas substances is:

$$n^* = n_2 - (n_j^* - n_{j1});$$

The changing pressure of gas during steady state, that is, the transient equation of gas-liquid model under charging state:

$$P_s = P_2 - P^* = P_2 - \frac{RT}{V}(n_2 + n_{j1} - n_j^*) = \frac{RT}{V}(n_j^* - n_{j1});$$

$$= \frac{RT}{V}\left(\frac{P_1 \varphi_m V_w}{RT + b_m P_1} - \frac{P^* \varphi_m V_w}{RT + b_m P^*}\right) =$$

$$\frac{R^2 T^2 \varphi_m V_w}{V b_m^2} \times \left(\frac{1}{\frac{RT}{b_m} + P_1} - \frac{1}{\frac{RT}{b_m} + P^*}\right);$$

Let $k_1 = \frac{R^2 T^2 \varphi_m V_w}{V b_m^2}, k_2 = \frac{RT}{b_m};$

From this, the implicit function relationship between the first steady state $P_1$, the transient $P_2$, and the second steady state $P^*$ is derived:

$$P_2 - P^* = \frac{k_1}{k_2 + P_1} - \frac{k_1}{k_2 + P^*}$$

The physical parameters in this model are non-negative, therefore $k_2 + P^* > 0$ and $k_2 + P_1 > 0$, and the above formula can be rewritten as:

$$P^{*2} + P^* \times \left(k_2 - P_2 + \frac{k_1}{k_2 + P_1}\right) + \left(\frac{k_1 k_2}{k_2 + P_1} - P_2 k_2 - k_1\right) = 0;$$

Actually, this equation is a quadratic equation about P*. Supposing:

$$a = 1, b = \left(k_2 - P_2 + \frac{k_1}{k_2 + P_1}\right), c = \left(\frac{k_1 k_2}{k_2 + P_1} - P_2 k_2 - k_1\right);$$

$$\Delta = b^2 - 4ac = \left(k_2 - P_2 + \frac{k_1}{k_2 + P_1}\right)^2 - 4\left(\frac{k_1 k_2}{k_2 + P_1} - P_2 k_2 - k_1\right)$$

The equation is simplified and rearranged as equation $$= \frac{1}{(k_2 + P_1)^2}[(k_2 + P_1)^4 + k_1^2 + 2(k_2 + P_1)(k_1 k_2 + k_1(2P_1 - P_2))]$$

When $\Delta t \to 0$, $P_1 \to P_2$. So existing $\Delta t$ makes $2P_1 > P_2$, resulting in $\Delta = b^2 - 4ac > 0$.

Therefore, the quadratic equation must have real roots. Supposing:

$$F(x) = x^2 + x \times \left(k_2 - P_2 + \frac{k_1}{k_2 + P_1}\right) + \left(\frac{k_1 k_2}{k_2 + P_1} - P_2 k_2 - k_1\right);$$

$$F(0) \cdot F(+\infty) < 0$$

Therefore, the charging steady state and transient recursion formula must have an only positive real root:

$$P^* = \frac{\left[\begin{array}{c} P_2 k_2 + P_1 P_2 - k_2^2 - P_1 k_2 + \\ \sqrt{(k_2 + P_1)^4 + k_1^2 + 2(k_2 + P_1)[k_1 k_2 + k_1(2P_1 - P_2)]} \end{array}\right]}{2(k_2 + P_1)},$$

$$k_1 = \frac{R^2 T^2 \varphi_m V_w}{V b_m^2}, k_2 = \frac{RT}{b_m}$$

In the above solution, the method for identifying the steady state and transient recursion formula of the lithium ion battery charging/discharging gas-liquid coexistence system includes GA genetic algorithm, neural network algorithm, Kalman filter algorithm, simulated annealing algorithm or artificial intelligence algorithm and other MATLAB optimization toolbox algorithms.

Furthermore, the method for identifying the parameters of the steady state and transient recursion formula of the lithium ion battery charging/discharging gas-liquid coexistence system is a GA genetic algorithm.

In the above scheme, the SOC estimation of the lithium ion battery is performed by using the parameters of the gas-liquid dynamic model for online estimation or offline estimation.

Compared with the existing technologies, the beneficial effects of this patent are:

1. The gas-liquid dynamic model is an analytical model. The recursive formula of the gas pressure P (equivalent to the open circuit voltage of the battery) under steady state conditions and the nozzle pressure $P_0$ (corresponding to the working voltage) under transient conditions are derived by strict equations. Moreover, it has been proved that the derived formula has no singular solution and the estimation result is unique.

2. The gas-liquid dynamic model SOC estimation recursion formula is simple, the amount of calculation is small, the estimation precision is high, and therefore it is easy to realize the accurate estimation on the microcontroller.

3. There is no input about time in the recursive formula of this gas-liquid dynamic model. Therefore, time decoupling is realized, and various errors caused by time input are eliminated.

4. The gas-liquid dynamic model SOC estimation recursion formula is robust to the initial value and the input parameter. This formula also can automatically reduce or even eliminate the error in the iterative process, and finally converge to the true value.

IV. DESCRIPTION OF DRAWINGS

Figure 2:
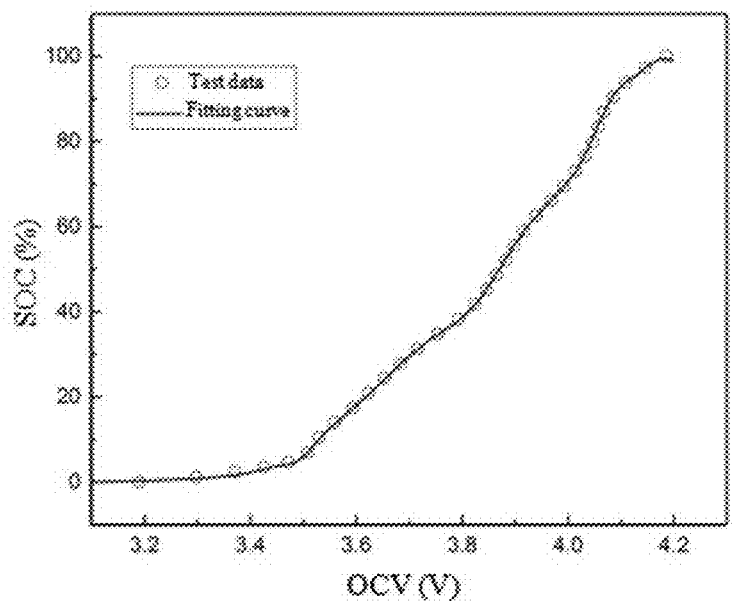
Figure 3:
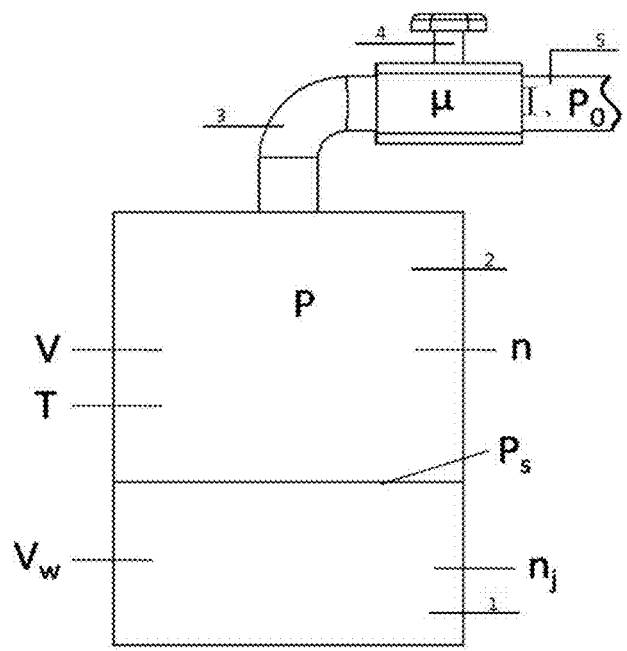
Figure 4:
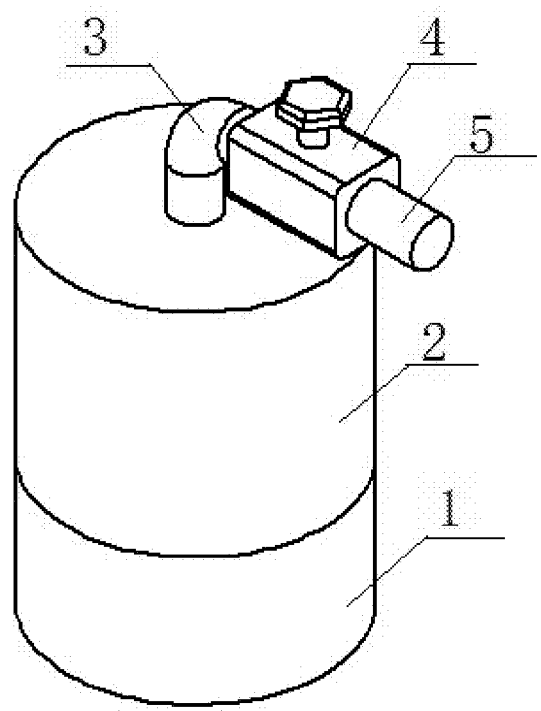
Figure 5:
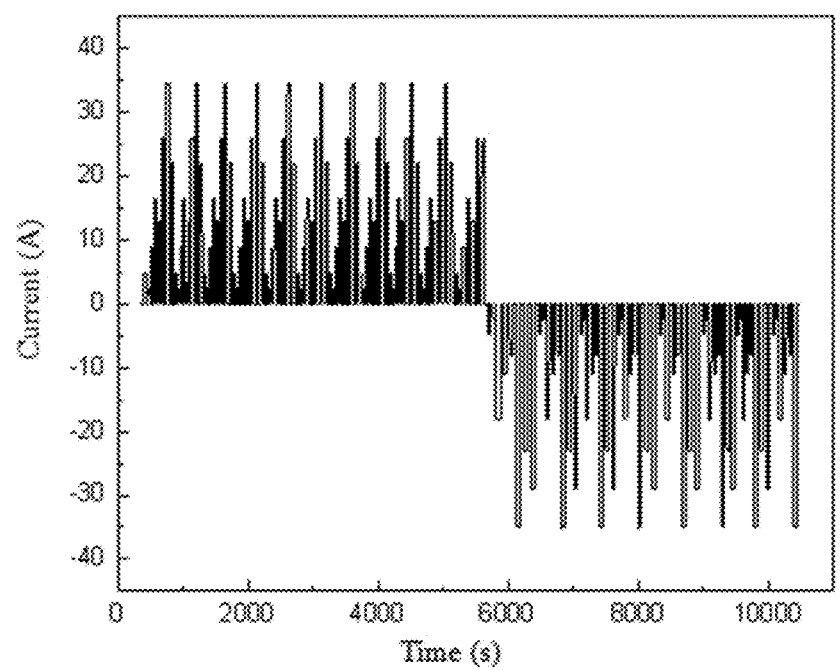
Figure 6:
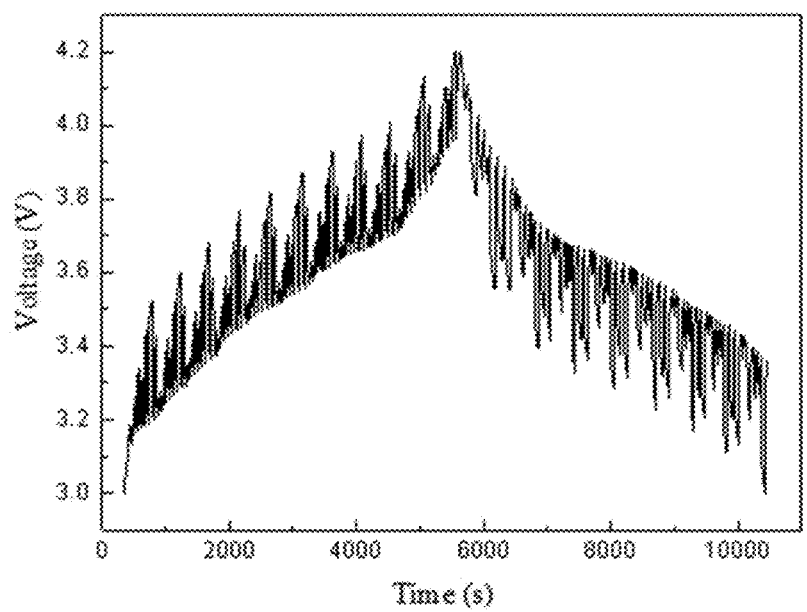

FIG. 1: Flow chart of the SOC estimation method based on gas-liquid dynamic model of this invention;

FIG. 2: The fitted curve of the relationship between the open circuit voltage and the SOC of this invention;

FIG. 3: Schematic diagram of the physical prototype of the gas-liquid dynamic model of this invention;

FIG. 4: Physical prototype part assembly diagram of the gas-liquid dynamic model of this invention;

FIG. 5: Time current graph of the test model in the first embodiment of this invention;

FIG. 6: A time-voltage graph of the test model of the first embodiment of the present invention.

Figure 7:
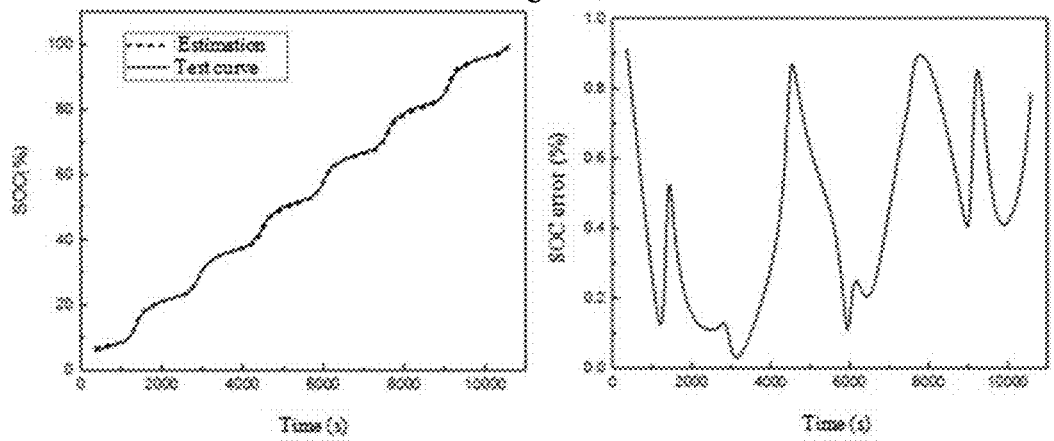
Figure 8:
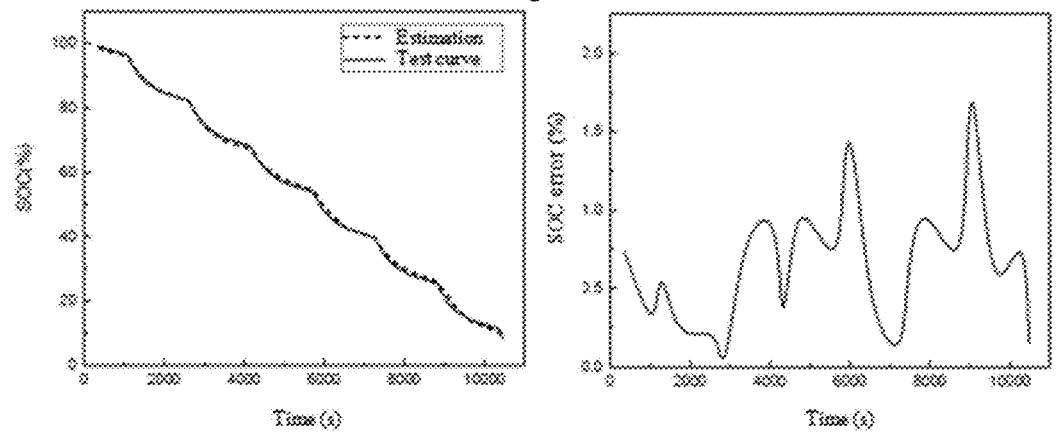

FIG. 7: SOC prediction and error diagram of charging model in the example 1 of this invention;

FIG. 8: SOC prediction and error diagram of discharging model in the example 1 of this invention FIG. 9: Time current plot of the test model in the example 2 of this invention FIG. 10: Time-voltage graph of the test model in the example 2 of this invention FIG. 11: SOC prediction diagram in the example 2 of this invention FIG. 12: error diagram in the example 2 of this invention FIG. 13: SOC prediction comparison chart after different cycle weeks in the example 2 of this invention FIG. 14. Comparison of prediction errors after different cycle weeks in the example 2 of this invention In the FIG.: 1. liquid; 2. gas; 3. pipeline; 4. valve;

V. EMBODIMENTS

This invention will be further described in detail below with reference to the accompanying drawings and specific implementation examples, but the scope of protection of this invention is not limited thereto.

As shown in FIG. 1, an accurate estimation method of SOC for lithium-ion batteries based on gas-liquid dynamics model includes the following steps:

A constant current intermittent charging-resting experiment is performed on a lithium ion battery, and the formula of relationship between the open circuit voltage (OCV) and the SOC is fitted according to the measured data;

A variable current intermittent charging/discharging-resting experiment is performed on a lithium ion battery. The OCV corresponding to SOC data is used to identify the parameters of the gas-liquid dynamic model;

Establishing a gas-liquid dynamic model: The physical prototype of the gas-liquid dynamic model is a cylindrical closed vessel which is a gas-liquid coexistence system. The pipe 3 and valve 4 are installed at the top of the vessel. There is $V_W$ volume of liquid 1 in the cylindrical vessel and the remaining volume V of the vessel is filled with the gas 2 whose pressure is P, the amount of substance is n and density is ρ. The resistance coefficient of whole pipeline 3 and valve 4 is μ. The external nozzle 5 gas pressure of the pipe 3 is $P_0$. When this gas-liquid coexistence system is in balance, the amount of gas moles dissolved in liquid is $n_j$. The pressure change of the gas from the non-steady state to the steady state in this system is $P_S$;

Derivation of charging/discharging SOC estimation model: Based on steady-state equation of gas-liquid model, the transient equation of gas-liquid model under charging/discharging is deduced. According to the gas-liquid dynamic model, the ideal gas state equation, the gas continuous motion equation and the gas gap filling solubility equation are listed;

According to the steady-state equation of gas-liquid model, the transient equation of gas-liquid model and the continuity equation of gas flow under discharging are deduced. The gas-liquid model transient equation is used to verify that the equations of gas-liquid steady state and transient state under discharging state have real roots and moreover, have only one positive real root;

According to the steady-state equation of gas-liquid model, the gas-liquid model transient equation is used to verify that the equations of gas-liquid steady state and transient state under charging state have real roots and moreover, have only one positive real root;

According to the variable current intermittent discharging-station experiment data, the parameters of the steady and transient recursion formula of the charging/discharging gas-liquid coexistence system are identified;

Battery SOC is estimated by using charging/discharging model;

A variable current pulse charging/discharging-station test on a lithium-ion battery is performed and the open circuit voltage and corresponding SOC data are recorded;

Verification of the charging/discharging SOC estimation model: The variable current pulse charging/discharging-station test data are used to verify the accuracy of predicting the open circuit voltage by the gas-liquid dynamic model;

The verified charging/discharging SOC estimation model is used to realize the accurate estimation of SOC of lithium-ion battery.

THE SPECIFIC IMPLEMENTATION EXAMPLES

Example 1

An aluminum shell square power battery for using on electric vehicles is chosen and its model is: ITRE017A17102B0146. Then, the constant current intermittent charging-static experiment is performed on it. According to the measured data, the formula of the relationship between the open circuit voltage OCV and SOC is fitted. FIG. 2 is the relationship curve obtained by fitting the fourth-order Gaussian operator of the piece wise function. Its expression is:

$$SOC = \begin{cases} 3.131 \times 10^{14} \times e^{\left(-\left(\frac{OCV-15.74}{2.16}\right)^2\right)} + 12.49 \times e^{\left(-\left(\frac{OCV-3.614}{0.1207}\right)^2\right)} \\ 31.18 \times e^{\left(-\left(\frac{OCV-4.202}{0.118}\right)^2\right)} + 6.594 \times e^{\left(-\left(\frac{OCV-4.083}{0.04655}\right)^2\right)} \end{cases}$$

$$- \begin{cases} 1.058 \times e^{\left(-\left(\frac{OCV-3.571}{0.02118}\right)^2\right)} + 2.602 \times e^{\left(-\left(\frac{OCV-3.501}{0.04226}\right)^2\right)} & OCV \leq 3.6V \\ 6.176 \times e^{\left(-\left(\frac{OCV-3.825}{0.07918}\right)^2\right)} - 72.26 \times e^{\left(-\left(\frac{OCV-4.097}{0.4248}\right)^2\right)} & OCV > 3.6V \end{cases}$$

As shown in FIGS. 3 and 4. The physical prototype of the gas-liquid dynamic model is a cylindrical closed vessel which is a gas-liquid coexistence system. The pipe 3 and valve 4 are installed at the top of the vessel. There is $V_W$ volume of liquid 1 in the cylindrical vessel and the remaining volume V of the vessel is filled with the gas 2 whose pressure is P, the amount of substance is n and density is ρ. The amount of gas moles dissolved in liquid is $n_j$ in balance. The nozzle 5 gas pressure is $P_0$. When the valve 4 is opened, the gas 2 in the vessel is discharged or charged at a flow rate I, and the gas local flow resistance coefficient is μ. When the gas in the vessel is discharged or charged, the pressure P changes and some of the gas is precipitated or dissolved from the liquid. After closing valve for a period of time, the system will reach the steady state again. At this time, the gas pressure in the vessel is P*. Based on the steady-state equation of gas-liquid dynamic model, the transient equation of gas-liquid model under charging/discharging state is derived. The gas-liquid coexistence system model includes an ideal gas or a non-ideal gas, an inorganic liquid and an organic liquid coexistence system.

(1) Based on the Steady-State Equation of Gas-Liquid Dynamic Model, the Transient Equation of Gas-Liquid Model Under Discharging State is Derived and its Steps are:

The gas-liquid dynamic model is in steady state at time $t_1$. At this moment, the gas pressure is $P_1$, and the amount of gas substance is $n_1$, and the amount of gas substance dissolved in the liquid is $n_{j1}$. When the valve 4 of the vessel is opened and the length of time is Δt, the gas in the system is released outward, and the flow rate of gas is I, and the resistance coefficient of whole pipeline is μ, and the pressure of the external nozzle 5 is $P_0$. The valve 4 is closed at the time $t_2 = t_1 + \Delta t$, at which time the gas pressure is $P_2$ and the amount of the gas substance is $n_2$. After a period of time, the gas-liquid dynamic model reaches the steady state again. At this time, the gas pressure in the vessel is P*, and the amount of gas substance is n*. $P_S$ is a pressure which changes when gas in the vessel changes from non-steady state to steady state.

At time $t_1$, the ideal gas state equation is $$P_1 V = n_1 RT,$$

T: thermodynamic temperature
$P_1$: gas pressure,
$n_1$: the amount of gas substance,
V: gas volume,
R: thermodynamic constant;
Solubility equation of gas gap filling:

$$n_{j1} = \frac{P_1 \varphi_m V_w}{RT + b_m P_1},$$

$\varphi_m$: Effective clearance
$b_m$: Van derwal volume
$V_W$: Liquid volume
The continuity equation of gas flow:

$$P_2 = P_0 + \tfrac{1}{2} \rho I^2 + \tfrac{1}{2} \mu \rho I,$$

ρ: the gas density
I: gas flow
μ: the resistance coefficient of whole pipeline
When the time is $t_2$, ideal gas equation of state:

$$P_2 V = n_2 RT$$

After the system reaches the steady state again after $t_2$, the ideal gas state equation:

$$P^*V = n^*RT;$$

Solubility equation for gas gap filling:

$$n_j^* = \frac{P^* \varphi_m V_w}{RT + b_m P^*}$$

$n_j^*$ is the amount of gas substance dissolved in the liquid after re-balance;
The relationship of amount of gas substances is:

$$n^* = n_2 + n_{j1} - n_j^*;$$

The changing pressure of gas during steady state:

$$P_s = P^* - P_2 = \frac{RT}{V}(n_2 + n_{j1} - n_j^*) - P_2 = \frac{RT}{V}(n_{j1} - n_j^*);$$

$$= \frac{RT}{V}\left(\frac{P_1 \varphi_m V_w}{RT + b_m P_1} - \frac{P^* \varphi_m V_w}{RT + b_m P^*}\right) =$$

$$\frac{R^2 T^2 \varphi_m V_w}{V b_m^2} \times \left(\frac{1}{\frac{RT}{b_n} + P^*} - \frac{1}{\frac{RT}{b_m} + P_1}\right);$$

Let $k_1 = \frac{R^2 T^2 \varphi_m V_w}{V b_m^2}, k_2 = \frac{RT}{b_m};$

From this, the implicit function relationship between the first steady state $P_1$, the transient $P_2$, and the second steady state $P^*$ is derived:

$$P^* - P_2 = \frac{k_1}{k_2 + P^*} - \frac{k_1}{k_2 + P_1}$$

The physical parameters in this model are non-negative, therefore $k_2 + P^* > 0$ and $k_2 + P_1 > 0$, and the above formula can be rewritten as:

$$P^{*2} + P^* \times \left(k_2 + P_2 + \frac{k_1}{k_2 + P_1}\right) + \left(\frac{k_1 k_2}{k_2 + P_1} - P_2 k_2 - k_1\right) = 0$$

This formula is a quadratic equation. Supposing $$a = 1, b = \left(k_2 - P_2 + \frac{k_1}{k_2 + P_1}\right), c = \left(\frac{k_1 k_2}{k_2 + P_1} - P_2 k_2 - k_1\right).$$

$$\Delta = b^2 - 4ac = \left(k_2 - P_2 + \frac{k_1}{k_2 + P_1}\right)^2 - 4\left(\frac{k_1 k_2}{k_2 + P_1} - P_2 k_2 - k_1\right)$$

This equation is simplified and rearranged as equation:

$$= \frac{1}{(k_2 + P_1)^2}[(k_2 + P_1)^4 + k_1^2 + 2(k_2 + P_1)(k_1 k_2 + k_1(2P_1 - P_2))]$$

Due to $P_1 > P_2$ then $\Delta = b^2 - 4ac > 0$.
Therefore, the quadratic equation must have real roots.

Supposing:

$$F(x) = x^2 + x \times \left(k_2 - P_2 + \frac{k_1}{k_2 + P_1}\right) + \left(\frac{k_1 k_2}{k_2 + P_1} - P_2 k_2 - k_1\right);$$

Because of $F(0) \cdot F(+\infty) < 0$
Therefore, the discharging steady state and transient recursion formula must have an only positive real root:

$$P^* = \frac{\left[\begin{array}{c} P_2 k_2 + P_1 P_2 - k_2^2 - P_1 k_2 + \\ \sqrt{(k_2 + P_1)^4 + k_1^2 + 2(k_2 + P_1)[k_1 k_2 + k_1(2P_1 - P_2)]} \end{array}\right]}{2(k_2 + P_1)},$$

$$k_1 = \frac{R^2 T^2 \varphi_m V_w}{V b_m^2}, k_2 = \frac{RT}{b_m};$$

Discharging transient gas flow continuity equation:

$$P_2 = P_0 + \tfrac{1}{2}\rho I^2 + \tfrac{1}{2}\mu\rho I;$$

Parameters need to be identified: $k_1$, $k_2$, $\rho$, $\mu$ ($\mu\rho$ is looked as a parameter);
The result of the GA genetic algorithm parameter identification is;

$k_1 = 9.962 \times 10^{-6}$, $k_2 = 9.535$, $\rho = 3.298 \times 10^{-4}$, $\mu = 3.960 \times 10^{-5}$.

Among them, the objective function of parameter identification is that the sum of the estimated errors is the smallest, and the constraint condition is that all physical quantities are greater than or equal to zero.

(2) Based on the Steady-State Equation of Gas-Liquid Dynamic Model, the Transient Equation of Gas-Liquid Model Under Charging State is Derived and its Steps are:

The gas-liquid dynamic model is in steady state at time $t_1$. At this moment, the gas pressure is $P_1$, and the amount of gas substance is $n_1$, and the amount of gas substance dissolved in the liquid is $n_{j1}$. When the valve 4 of the vessel is opened and the length of time is $\Delta t$, the gas in the system is forcibly charged into the vessel and the flow rate of gas is I, and the resistance coefficient of whole pipeline is $\mu$, and the pressure of the external nozzle 5 is $P_0$. The valve 4 is closed at the time $t_2 = t_1 + \Delta t$, at which time the gas pressure is $P_2$ and the amount of the gas substance is $n_2$. After a period of time, the gas-liquid dynamic model reaches the steady state again. At this time, the gas pressure in the vessel is $P^*$, and the amount of gas substance is $n^*$. $P_S$ is a pressure which changes when gas in the vessel changes from non-steady state to steady state.

At time $t_1$, the ideal gas state equation is $$P_1 V = n_1 RT,$$

T: thermodynamic temperature
$P_1$: gas pressure,
$n_1$: the amount of gas substance,
V: gas volume,
R: thermodynamic constant;
Solubility equation of gas gap filling:

$$n_{j1} = \frac{P_1 \varphi_m V_w}{RT + b_m P_1},$$

$\varphi_m$: Effective clearance
$b_m$: Van derwal volume
$V_W$: Liquid volume

The continuity equation of gas flow:

$$P_0 = P + \tfrac{1}{2}\rho I^2 + \tfrac{1}{2}\mu\rho I$$

When the time is $t_2$, ideal gas equation of state:

$$P_2 V = n_2 RT$$

After the system reaches the steady state again after $t_2$, the ideal gas state equation:

$$P^* V = n^* RT;$$

Solubility equation for gas gap filling:

$$n_j^* = \frac{P^* \varphi_m V_w}{RT + b_m P^*}$$

$n_j^*$ is the amount of gas substance dissolved in the liquid after re-balance;
The relationship of amount of gas substances is:

$$n^* = n_2 - (n_j^* - n_{j1});$$

The changing pressure of gas during steady state:

$$P_s = P_2 - P^* = P_2 - \frac{RT}{V}(n_2 + n_{j1} - n_j^*) = \frac{RT}{V}(n_j^* - n_{j1});$$

$$= \frac{RT}{V}\left(\frac{P_1 \varphi_m V_w}{RT + b_m P_1} - \frac{P^* \varphi_m V_w}{RT + b_m P^*}\right) =$$

$$\frac{R^2 T^2 \varphi_m V_w}{V b_m^2} \times \left(\frac{1}{\frac{RT}{b_m} + P_1} - \frac{1}{\frac{RT}{b_m} + P^*}\right);$$

Let $k_1 = \dfrac{R^2 T^2 \varphi_m V_w}{V b_m^2}, k_2 = \dfrac{RT}{b_m};$

From this, the implicit function relationship between the first steady state $P_1$, the transient $P_2$, and the second steady state $P^*$ is derived:

$$P_2 - P^* = \frac{k_1}{k_2 + P_1} - \frac{k_1}{k_2 + P^*}$$

The physical parameters in this model are non-negative, therefore $k_2 + P^* > 0$ and $k_2 + P_1 > 0$, and the above formula can be rewritten as:

$$P^{*2} + P^* \times \left(k_2 - P_2 + \frac{k_1}{k_2 + P_1}\right) + \left(\frac{k_1 k_2}{k_2 + P_1} - P_2 k_2 - k_1\right) = 0$$

This formula is a quadratic equation. Supposing $$a = 1, b = \left(k_2 - P_2 + \frac{k_1}{k_2 + P_1}\right), c = \left(\frac{k_1 k_2}{k_2 + P_1} - P_2 k_2 - k_1\right).$$

$$\Delta = b^2 - 4ac = \left(k_2 - P_2 + \frac{k_1}{k_2 + P_1}\right)^2 - 4\left(\frac{k_1 k_2}{k_2 + P_1} - P_2 k_2 - k_1\right)$$

This equation is simplified and rearranged as equation:

$$= \frac{1}{(k_2 + P_1)^2}[(k_2 + P_1)^4 + k_1^2 + 2(k_2 + P_1)(k_1 k_2 + k_1(2P_1 - P_2))]$$

When $\Delta t \to 0$, $P_1 \to P_2$. So existing $\Delta t$ makes $2P_1 > P_2$, resulting in $\Delta = b^2 - 4ac > 0$.

Therefore, the quadratic equation must have real roots. Supposing:

$$F(x) = x^2 + x \times \left(k_2 - P_2 + \frac{k_1}{k_2 + P_1}\right) + \left(\frac{k_1 k_2}{k_2 + P_1} - P_2 k_2 - k_1\right);$$

Because of $F(0) \cdot F(+\infty) < 0$
Therefore, the discharging steady state and transient recursion formula must have an only positive real root:

$$P^* = \frac{\left[\begin{array}{c} P_2 k_2 + P_1 P_2 - k_2^2 - P_1 k_2 + \\ \sqrt{(k_2 + P_1)^4 + k_1^2 + 2(k_2 + P_1)[k_1 k_2 + k_1(2P_1 - P_2)]} \end{array}\right]}{2(k_2 + P_1)},$$

$$k_1 = \frac{R^2 T^2 \varphi_m V_w}{V b_m^2}, k_2 = \frac{RT}{b_m};$$

Charging transient gas flow continuity equation:

$$P_2 = P_0 - (\tfrac{1}{2}\rho I^2 + \tfrac{1}{2}\mu\rho I);$$

Parameters need to be identified: $k_1$, $k_2$, $\rho$, $\mu$ ($\mu\rho$ is looked as a parameter);
The result of the GA genetic algorithm parameter identification is;
$k_1 = 0.3122$, $k_2 = 5.498$, $\rho = 3.230 \times 10^{-7}$, $\mu = 9.835 \times 10^{-3}$.

FIGS. 5 and 6 are time current and voltage graphs for verifying the accuracy of the SOC estimation model, and the charging and discharging method is a variable current pulse method.

FIG. 7(a) is a charging model prediction diagram. FIG. 7(b) is an error diagram. FIG. 8(a) is a discharging model prediction diagram, and FIG. 8(b) is an error diagram; As can be seen from FIG. 7(b), the maximum error of the estimation realized by the charging model does not exceed 1%. It can be seen from FIG. 8(b) that the maximum error of the estimation realized by the discharging model does not exceed 2%, which can fully meet the practical application of electric vehicles.

Example 2

In the first implementation example, the variable current pulse method is used to verify the accuracy of the SOC charging model and the SOC discharging model, that is, there is no discharging process during charging and no charging process during discharging. However, in the actual application process, the pure electric vehicle can use the brake to charge the battery to recover part of the electric energy during the driving process, that is to say, there will be charging phenomenon during the driving process of the driving. In the second implementation example, the experimental method for verifying the SOC estimation model is based on the national standard GB/T 31484-2015. 6.5.3 Experimental method for energy-type battery for pure electric passenger vehicle. A car power soft pack battery is selected and its model is FB27204A1D6033.

The integrated model is a model that combines the charging model and the discharging model in the first example, that is:
The SOC of the battery is estimated by using discharging model when battery is discharging:

$$P^* = \frac{\left[\begin{array}{c} P_2 k_2 + P_1 P_2 - k_2^2 - P_1 k_2 + \\ \sqrt{(k_2+P_1)^4 + k_1^2 + 2(k_2+P_1)[k_1 k_2 + k_1(2P_1 - P_2)]} \end{array}\right]}{2(k_2 + P_1)},$$

$$k_1 = \frac{R^2 T^2 \varphi_m V_w}{V b_m^2}, \quad k_2 = \frac{RT}{b_m};$$

Discharging transient gas flow continuity equation:

$$P_2 = P_0 + \frac{1}{2}\rho I^2 + \frac{1}{2}\mu \rho I;$$

The result of the GA genetic algorithm parameter identification is $k_1 = 1.739 \times 10^{-3}$, $k_2 = 10.710$, $\rho = 3.111 \times 10^{-4}$, $\mu = 7.092 \times 10^{-4}$ The SOC of the battery is estimated by using charging model when battery is charging:

$$P^* = \frac{\left[\begin{array}{c} P_2 k_2 + P_1 P_2 - k_2^2 - P_1 k_2 + \\ \sqrt{(k_2+P_1)^4 + k_1^2 + 2(k_2+P_1)[k_1 k_2 + k_1(2P_1 - P_2)]} \end{array}\right]}{2(k_2 + P_1)},$$

$$k_1 = \frac{R^2 T^2 \varphi_m V_w}{V b_m^2}, \quad k_2 = \frac{RT}{b_m};$$

Charging transient gas flow continuity equation:

$$P_2 = P_0 - (\frac{1}{2}\rho I^2 + \frac{1}{2}\mu \rho I);$$

Figure 9:
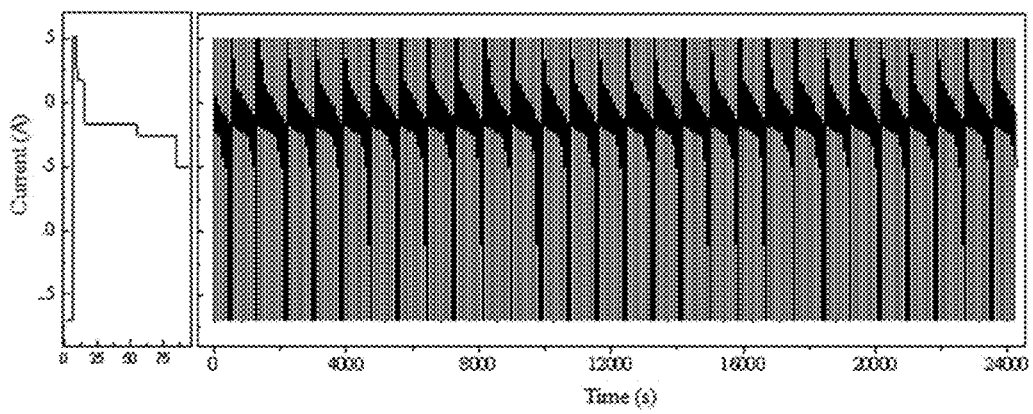
Figure 10:
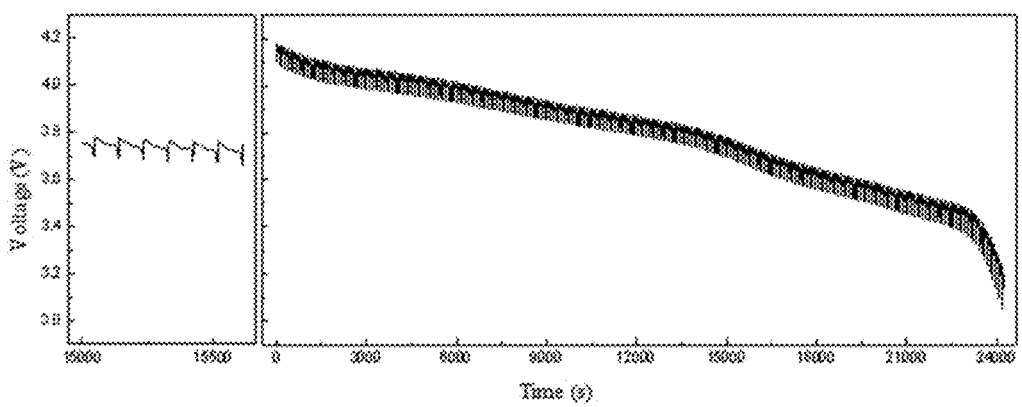

The result of the GA genetic algorithm parameter identification is $k_1 = 0.1461$, $k_2 = 5.005$, $\rho = 4.279 \times 10^{-5}$, $\mu = 6.732 \times 10^{-3}$ FIGS. 9 and 10 are the time current and voltage curves for verifying the accuracy of the SOC estimation model. The charging and discharging method is the 6.5.3 pure electric passenger vehicle energy battery test method of GB/T 31484-2015.

Figure 11:
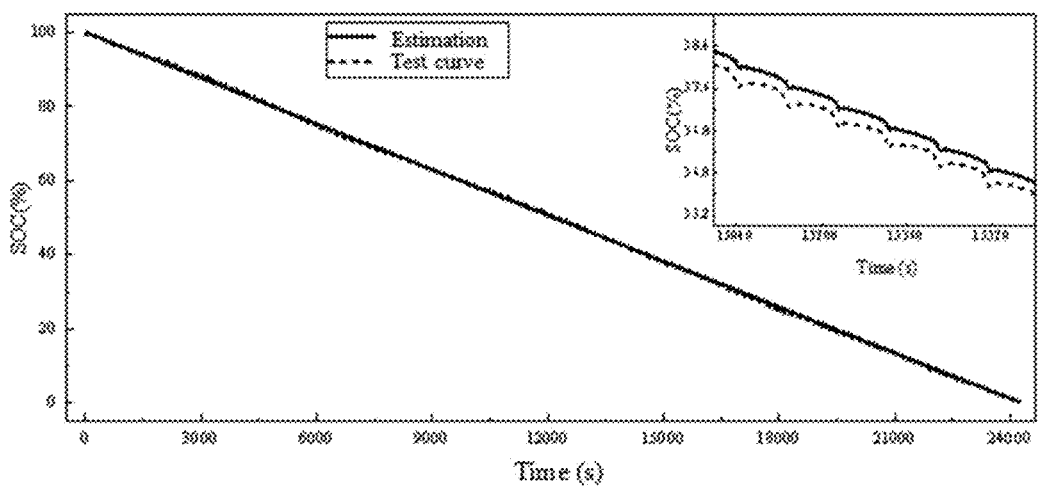
Figure 12:
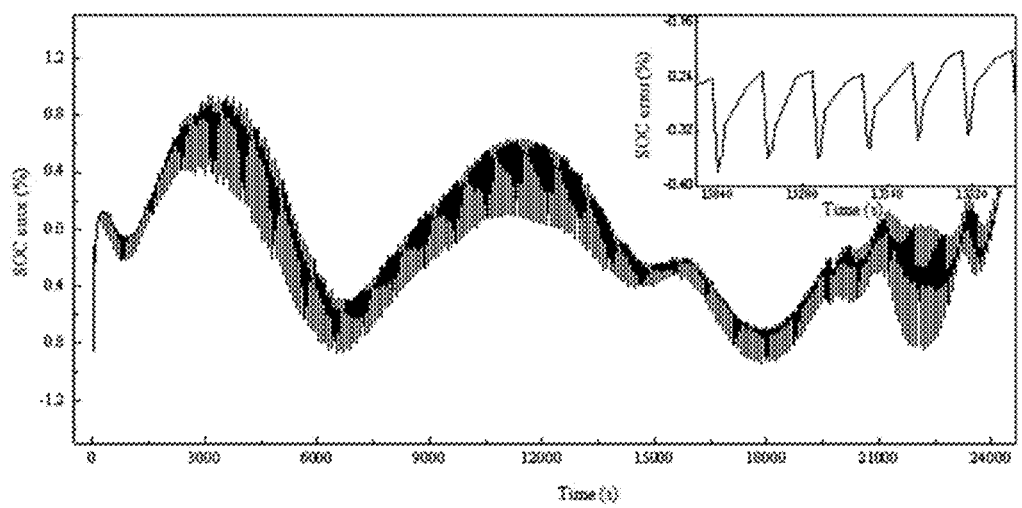

FIG. 11 is a integrated model prediction chart, and FIG. 12 is a integrated model prediction error chart. It can be seen from FIG. 12 that the maximum error estimated by the integrated model is less than 1%, which can fully meet the practical application of electric vehicles.

Figure 13:
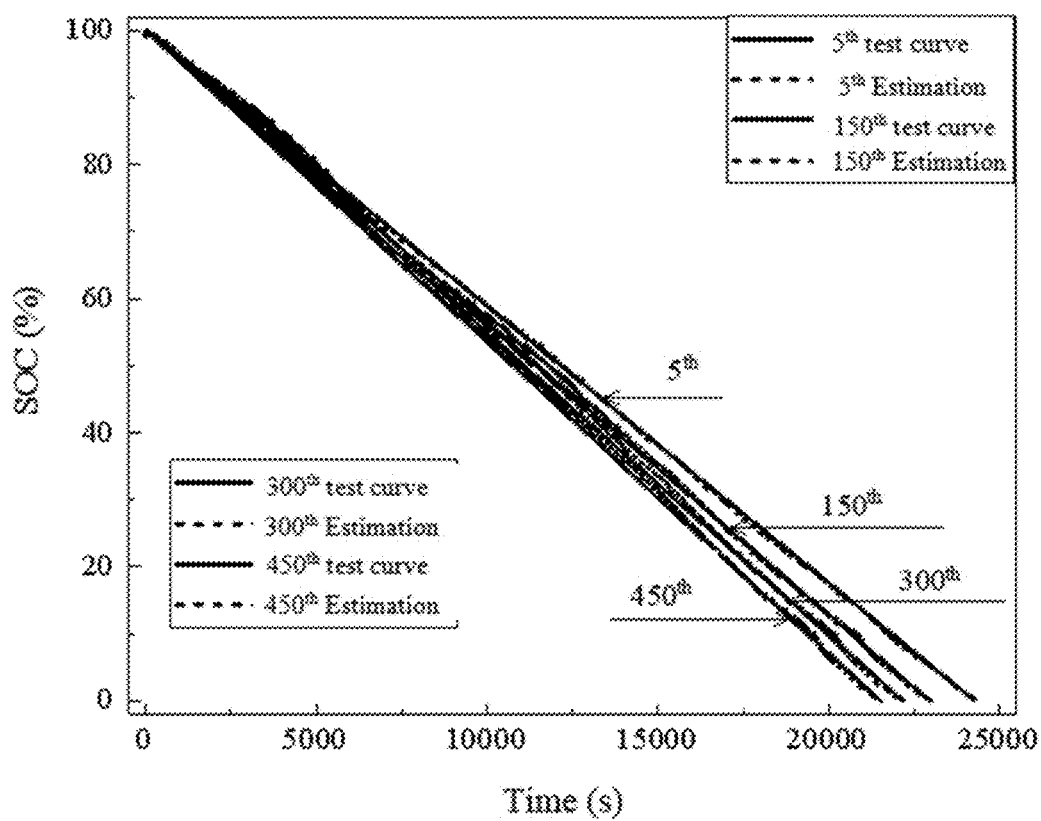
Figure 14:
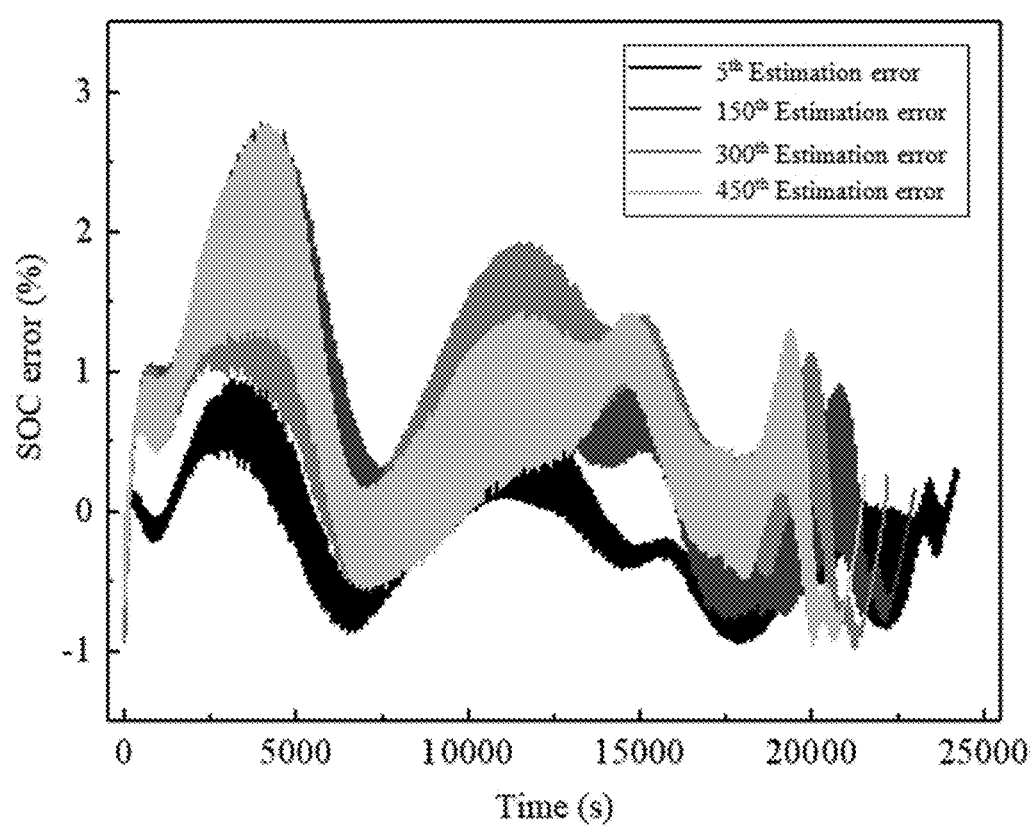

FIG. 13 is an integrated model prediction chart. The experimental data is tested according to the test method of 6.5.3 pure electric passenger vehicle energy storage battery based on GB/T 31484-2015. It can be seen from FIG. 13 that the offline parameter model can still be used for online estimation after 150, 300, and 450 charging and discharging cycles of the battery. It is not necessary to repeat the parameter identification during the whole estimation process. The parameters identified for the first time can be used during the whole estimation process. From FIG. 14, it can be seen that with the amount of charging and discharging cycles of the battery increasing, the error of the estimation has increased, but it is still within 3%, and the added error is basically in the period before the battery SOC is higher than 80%. When the battery SOC is lower than 30%, the error increase is not obvious. Therefore, the characteristics are more in line with the actual application.

The series of detailed descriptions set forth above are merely specific illustrations of possible implementations of this invention. They are not intended to limit the scope of protection of this invention. Equivalent implementations or modifications that do not depart from the spirit of the invention are intended to be included within the scope of protection of this invention.

The invention claimed is:

1. A method for accurately estimating SOC of a lithium ion battery based on a gas-liquid dynamic model, characterized in that it comprises the following steps:
   a constant current intermittent charging-resting experiment is performed on a lithium ion battery, and the formula of relationship between the open circuit voltage (OCV) and the SOC is fitted according to the measured data;
   a variable current intermittent charging/discharging-resting experiment is performed on a lithium ion battery, the OCV corresponding to SOC data is used to identify the parameters of the gas-liquid dynamic model;
   establishing a gas-liquid dynamic model: the physical prototype of the gas-liquid dynamic model is a cylindrical closed vessel which is a gas-liquid coexistence system, the pipe (3) and valve (4) are installed at the top of the vessel, there is $V_W$ volume of liquid (1) in the cylindrical vessel and the remaining volume V of the vessel is filled with the gas (2) whose pressure is P, the amount of substance is n and density is $\rho$; the resistance coefficient of whole pipeline (3) and valve (4) is $\mu$, the external nozzle (5) gas pressure of the pipe (3) is $P_0$; when this gas-liquid coexistence system is in balance, the amount of gas moles dissolved in liquid is $n_j$, the pressure change of the gas from the non-steady state to the steady state in this system is $P_S$;
   deriving the SOC estimation model of charge and discharge: according to gas-liquid dynamics model,
   the transient equation of gas-liquid model is deduced according to the steady-state equation of gas-liquid model in discharging; to verify the steady-state and transients equation of gas-liquid model have real roots and moreover, have only one positive real root in discharging; the transient equation of gas-liquid model is deduced according to the steady-state equation of gas-liquid model in charging; to verify the steady-state and transients equation of gas-liquid model have real roots and moreover, have only one positive real root in charging;
   according to the variable current intermittent discharging-resting experiment data, the parameters of the steady and transient recursion formula are identified in gas-liquid coexistence system of the charging and discharging;
   battery SOC is estimated by using charging/discharging model;
   a variable current pulse charging/discharging-resting test on a lithium-ion battery is performed and the open circuit voltage and corresponding to SOC data are recorded;
      to verify the SOC estimation model of charge and discharge: according to the variable current pulse charging/discharging-resting data, the accuracy of predicting the open circuit voltage is verified by the gas-liquid dynamic model;
   the verified SOC estimation model of charge and discharge is used to realize the accurate estimation of SOC for lithium-ion battery.

2. According to claim 1, a method for accurately estimating SOC of lithium ion battery, based on gas-liquid dynamic model, is characterized in that the following is the step of deriving a transient equation of a gas-liquid model in a discharge state according to a steady-state equation of a gas-liquid model:
   the gas-liquid dynamic model is in steady state at time $t_1$, at this moment, the gas pressure is $P_1$, and the amount of gas substance is $n_1$, and the amount of gas substance dissolved in the liquid is $n_{j1}$; when the valve (4) of the vessel is opened and the length of time is $\Delta t$, the gas in the system is released outward, and the flow rate of gas is I, and the resistance coefficient of whole pipeline is $\mu$, and the pressure of the external nozzle (5) is $P_0$; the valve (4) is closed at the time $t_2=t_1+\Delta t$, at which time the gas pressure is $P_2$ and the amount of the gas substance is $n_2$; after a period of time, the gas-liquid dynamic model reaches the steady state again, at this time, the gas pressure in the vessel is $P^*$, and the amount of gas substance dissolved in liquid is $n_{j2}$, $P_S$ is a pressure which changes when gas in the vessel changes from non-steady state to steady state, The continuity equation of gas flow when the gas comes out of the vessel:

$P_2=P_0+½\rho I^2+½\mu\rho I$, $\rho$: the gas density.

3. According to claim 2, a method for accurately estimating SOC of lithium ion battery based on gas-liquid dynamic model is characterized in that at time $t_1$, the ideal gas state equation is $P_1 V = n_1 RT$, T: thermodynamic temperature
$P_1$: gas pressure,
$n_1$: the amount of gas substance,
V: gas volume,
R: thermodynamic constant;
solubility equation of gas gap filling:

$$n_{j1} = \frac{P_1 \varphi_m V_w}{RT + b_m P_1},$$

$\varphi_m$: effective clearance
$b_m$: Van der Waals volume
$V_W$: liquid volume
the continuity equation of gas flow:

$P_2=P_0+½\rho I^2+½\mu\rho I$, $\rho$: the gas density
I: gas flow
$\mu$: the resistance coefficient of whole pipeline
when the time is $t_2$, ideal gas equation of state:

$P_2 V = n_2 RT$ after the system reaches the steady state again after $t_2$, the ideal gas state equation:

$P^* V = n^* RT$;

solubility equation for gas gap filling:

$$n_j^* = \frac{P^* \varphi_m V_w}{RT + b_m P^*}$$

the amount of gas substances is $n^* = n_2 + n_{j1} - n_j^*$.

4. According to claim 3, a method for accurately estimating SOC of lithium ion battery based on gas-liquid dynamic model is characterized in that, the changing pressure of gas during steady state, that is, the transient equation of gas-liquid model under discharging state:

$$P_s = P^* - P_2 = \frac{RT}{V}(n_2 + n_{j1} - n_j^*) - P_2 = \frac{RT}{V}(n_{j1} - n_j^*);$$

$$= \frac{RT}{V}\left(\frac{P_1 \varphi_m V_w}{RT + b_m P_1} - \frac{P^* \varphi_m V_w}{RT + b_m P^*}\right) =$$

$$\frac{R^2 T^2 \varphi_m V_w}{V b_m^2} \times \left(\frac{1}{\frac{RT}{b_m} + P^*} - \frac{1}{\frac{RT}{b_m} + P_1}\right);$$

Let $k_1 = \frac{R^2 T^2 \varphi_m V_w}{V b_m^2}$, $k_2 = \frac{RT}{b_m}$;

from this, the implicit function relationship between the first steady state $P_1$, the transient $P_2$, and the second steady state $P^*$ is derived:

$$P^* - P_2 = \frac{k_1}{k_2 + P^*} - \frac{k_1}{k_2 + P_1}$$

the discharging steady state and transient recursion formula must have an only positive real root:

$$P^* = \frac{\left[\begin{array}{c} P_2 k_2 + P_1 P_2 - k_2^2 - P_1 k_2 + \\ \sqrt{(k_2+P_1)^4 + k_1^2 + 2(k_2+P_1)[k_1 k_2 + k_1(2P_1 - P_2)]} \end{array}\right]}{2(k_2 + P_1)},$$

$k_1 = \frac{R^2 T^2 \varphi_m V_w}{V b_m^2}$, $k_2 = \frac{RT}{b_m}$.

5. According to claim 1, a method for accurately estimating SOC of lithium ion battery based on gas-liquid dynamic model is characterized in that the specific steps of the gas-liquid model transient equation in the charging state based on the steady-state equation of the gas-liquid model include the following steps:

the gas-liquid dynamic model is in steady state at time $t_1$, at this moment, the gas pressure is $P_1$, and the amount of gas substance is $n_1$, and the amount of gas substance dissolved in the liquid is $n_{j1}$; when the valve (4) of the vessel is opened and the length of time is $\Delta t$, the outside gas is charged into the vessel at a flow rate of I, and the resistance coefficient of whole pipeline (3) is $\mu$, and the pressure of the external nozzle (5) is $P_0$; the valve (4) is closed at the time $t_2=t_1+\Delta t$, at which time the gas pressure is $P_2$ and the amount of the gas substance is $n_2$; after a period of time, the gas-liquid dynamic model reaches the steady state again, at this time, the gas pressure in the vessel is $P^*$, and the amount of gas substance dissolved in liquid is $n_{j2}$; $P_S$ is a pressure which changes when gas in the vessel changes from non-steady state to steady state, the continuity equation of gas flow when the outside gas is charged into the vessel:

$P_2=P_0-(½\rho I^2+½\mu\rho I)$, $\rho$: the gas density.

6. According to claim 5, a method for accurately estimating SOC of lithium ion battery based on gas-liquid dynamic model is characterized in that at time $t_1$, the ideal gas state equation is $P_1 V = n_1 RT$, T: thermodynamic temperature,
P$_1$: gas pressure,
n$_1$: the amount of gas substance,
V: gas volume,
R: thermodynamic constant;
solubility equation of gas gap filling:

$$n_{j1} = \frac{P_1 \varphi_m V_w}{RT + b_m P_1},$$

$\varphi_m$: effective clearance,
b$_m$: Van der Waals volume,
V$_W$: liquid volume,
the continuity equation of gas flow:

$$P_0 = P + \tfrac{1}{2}\rho I^2 + \tfrac{1}{2}\mu \rho I;$$

when the time is t$_2$, ideal gas equation of state:

$$P_2 V = n_2 RT;$$

after the system reaches the steady state again after t$_2$, the ideal gas state equation:

$$P^* V = n^* RT;$$

solubility equation for gas gap filling:

$$n_j^* = \frac{P^* \varphi_m V_w}{RT + b_m P^*}$$

n$^*_j$ is the amount of gas substance dissolved in the liquid after re-balance;
the amount of gas substances is $$n^* = n_2 - (n^*_j - n_{j1}).$$

7. According to claim 6, a method for accurately estimating SOC of lithium ion battery based on gas-liquid dynamic model is characterized in that,
the changing pressure of gas during steady state, that is, the transient equation of gas-liquid model under discharging state:

$$P_s = P_2 - P^* = P_2 - \frac{RT}{V}(n_2 + n_{j1} - n_j^*) = \frac{RT}{V}(n_j^* - n_{j1});$$

$$= \frac{RT}{V}\left(\frac{P_1 \varphi_m V_w}{RT + b_m P_1} - \frac{P^* \varphi_m V_w}{RT + b_m P^*}\right) =$$

$$\frac{R^2 T^2 \varphi_m V_w}{V b_m^2} \times \left(\frac{1}{\frac{RT}{b_m} + P_1} - \frac{1}{\frac{RT}{b_m} + P^*}\right);$$

Let $k_1 = \frac{R^2 T^2 \varphi_m V_w}{V b_m^2}$, $k_2 = \frac{RT}{b_m}$;

from this, the implicit function relationship between the first steady state P$_1$, the transient P$_2$, and the second steady state P* is derived:

$$P_2 - P^* = \frac{k_1}{k_2 + P_1} - \frac{k_1}{k_2 + P^*}$$

the discharging steady state and transient recursion formula must have an only positive real root:

$$P^* = \frac{\left[\begin{array}{c} P_2 k_2 + P_1 P_2 - k_2^2 - P_1 k_2 + \\ \sqrt{(k_2 + P_1)^4 + k_1^2 + 2(k_2 + P_1)[k_1 k_2 + k_1(2P_1 - P_2)]} \end{array}\right]}{2(k_2 + P_1)},$$

$$k_1 = \frac{R^2 T^2 \varphi_m V_w}{V b_m^2}, k_2 = \frac{RT}{b_m}.$$

8. According to claim 1, a method for accurately estimating SOC of lithium ion battery based on gas-liquid dynamic model is characterized in that the method for identifying the steady state and transient recursion formula of the lithium ion battery charging/discharging gas-liquid coexistence system includes GA genetic algorithm, neural network algorithm, Kalman filter algorithm, simulated annealing algorithm or artificial intelligence algorithm.

9. According to claim 8, a method for accurately estimating SOC of lithium ion battery based on gas-liquid dynamic model is characterized in that the method for identifying the parameters of the steady state and transient recursion formula of the lithium ion battery charging/discharging gas-liquid coexistence system is a GA genetic algorithm.

10. According to claim 1, a method for accurately estimating SOC of lithium ion battery based on gas-liquid dynamic model is characterized in that the SOC estimation of the lithium ion battery is performed by using the parameters of the gas-liquid dynamic model for online estimation or offline estimation.

\* \* \* \* \*